CYCLIC POLYISOPRENE PHOTORESIST COMPOSITIONS

Filed Oct. 15, 1970 5 Sheets-Sheet 1

INVENTOR
RAM K. AGNIHOTRI
BY [signature]
ATTORNEY

CYCLIC POLYISOPRENE PHOTORESIST COMPOSITIONS

Filed Oct. 15, 1970 5 Sheets-Sheet 2

United States Patent Office 3,669,662

Patented June 13, 1972

3,669,662

CYCLIC POLYISOPRENE PHOTORESIST COMPOSITIONS

Ram K. Agnihotri, Fishkill, N.Y., assignor to International Business Machines Corporation, Armonk, N.Y.

Filed Oct. 15, 1970, Ser. No. 80,853
Int. Cl. G03c *1/52*
U.S. Cl. 96—75 8 Claims

ABSTRACT OF THE DISCLOSURE

A light-sensitive photoresist composition comprised of a cyclized polyisoprene polymer and a bis-diazide photoinitiator; and light-sensitive elements coated with such compositions.

FIELD OF THE INVENTION

This disclosure relates to photosensitive compositions, and more particularly to negative photoresist compositions for use in photolithographic and photomechanical process for photomasking systems employed in the fabrication of printed circuits, microcircuits, semiconductors, printing plates, dies and the like normally employed in other lithographic arts.

DESCRIPTION OF THE PRIOR ART

An extensive number of negative photosensitive or photoresist compositions are known or have been proposed for photomasking of various supports in the manufacture of printed circuits, microcircuits, semiconductors and the like as indicated above. Typical of such negative photoresist compositions are those described in U.S. Patents, No. 2,852,379 and No. 2,940,853.

In use, these negative photoresist compositions are first coated from solutions thereof by conventional methods, such as dipping, spraying, spin-coating and the like, on a suitable support on which the photoresist compositions are processed into suitable resist-masks for further processing of the substrate. Typically, these substrates may comprise a copper-coated phenolic board for making of printed circuits, or an oxidized surface as required in manufacturing semiconductor devices. This photoresist coating is then exposed to light, e.g., ultraviolet, through a suitable mask in a pattern complementary to the area of substrated surface to be exposed, e.g., to the portion of the unexposed photoresist coating to be removed. The exposed portions of the photoresist becomes insolubilized, usually by cross-linking, permitting the unexposed portions of the photoresist coating to be dissolved or washed away by solvents in development of the photoresist mask. The exposed surface of the substrate may then be suitably treated as required, which typically may include etching of the above noted copper-clad and oxidized semiconductor substrates in the corresponding production of printed circuits and semiconductor devices. After processing of the substrate, the remaining photoresist coated mask may be removed with suitable solvents.

Among the more widely used photoresist compositions in the semiconductor industires are those comprised of cyclized polyisoprene and an aryl bis-diazide sensitizer such as described in the above noted U.S. Pats. 2,852,379 and 2,940,853. Although such photoresist compositions have enjoyed marked success in the manufacture of semiconductor devices (including integrated devices) in accordance with technologies here-to-date, such photoresist compositions have been, however, characterized with limitations in their proposed use with further miniaturization of semiconductor devices. Typical of such limitations is failure to provide the requisite resolution required in resist masks for delineation of line openings of the order of 2.5 microns or less in the oxide surface of semiconductor substrates; insufficient adhesion of the resist coating to the silicon oxide surface resulting in undercutting of the oxide during etching thereof; and limitations in solubility and structure which are reflected in obtaining proper thickness of resist coatings and development thereof, which resist coatings normally are employed in the order of 2000 to 10,000 angstrom thickness.

SUMMARY OF THE INVENTION

It has now been discovered, in accordance with this invention, that negative photoresist compositions providing desired resolutions in masking, solubility, developing, adhesion and etch resistance can be formulated from 1,4-polyisoprene cyclized within controlled ranges in conjunction with aryl bis-diazides such as described in the above noted U.S. Pats. 2,852,379 and 2,940,853.

Accordingly it is an object of this invention to provide novel photoresist compositions.

Another object of this invention is to provide novel photosensitive compositions for use in photoresist applications.

A further object of this invention is to provide novel negative photoresist compositions.

A still further object of this invention is to provide novel photosensitive elements including a support coated with a layer of the photoresist compositions disclosed herein.

The foregoing and other objects, features and advantages of the invention will be apparent from the following more particular description of preferred embodiments of the invention as illustrated in the accompanying drawings wherein.

DESCRIPTION OF THE PREFERRED EMBODIMENTS

The foregoing indicated objects are obtained in accordance with this invention by a film-forming photosensitive composition comprised of an aryl bis-diazide photosensitizer and a cyclized cis-1,4-polyisoprene polymer having, as further defined below herein, a cyclicity of from about 1.3 to about 2 with about 6 to about 14% uncyclized isoprene units and having a chain length of average molecular weight size in the range of from about 3000 to about 6000 angstroms.

Figure 1:
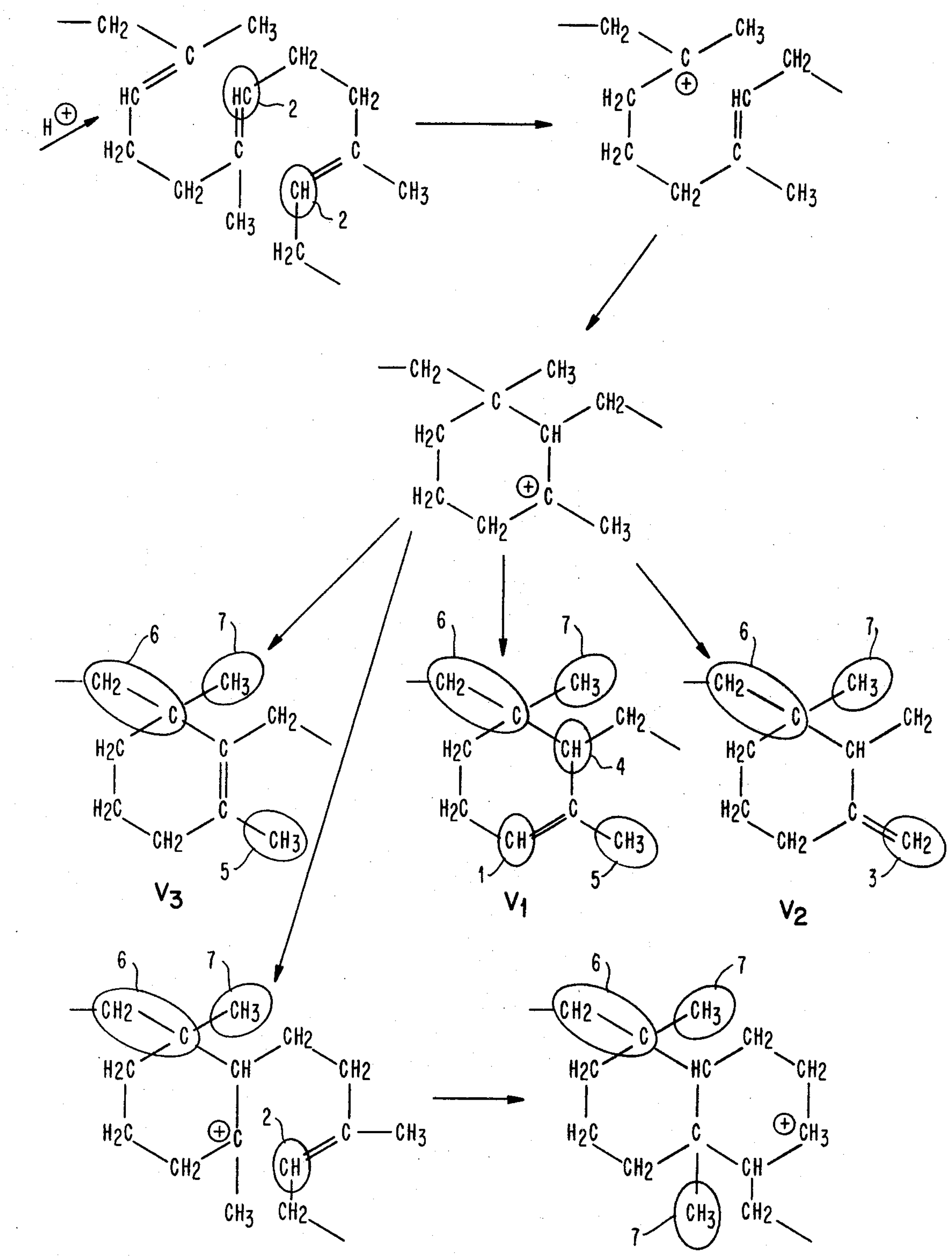
FIG. 1 shows the reaction scheme in the cyclization of polyisoprene.

These cyclized polymers were prepared from commercial cis-1,4-polyisoprenes with p-toluene-sulfonic acid as a catalyst by a process based on the procedure described by J. J. Janssen in "Preparation and Use of Cyclized Rubber as a Stiffening Resin in Rubber," Rubber Age, February 1956, pp. 718–722. The reaction scheme of cyclization is shown in FIG. 1 illustrating monocyclicity (cyclicity 1) and bicyclicity (cyclicity 2) which upon further cyclization gives rise to products of higher cyclicity, ranging to a cyclicity of 6 as obtained below herein. The progress of and cyclization of cis-1,4-polyisoprene was measured by infrared spectra, nuclear magnetic resonance (NMR) spectra based on a high temperature modification of the procedure of M. A. Golub et al. described in "High Resolution Nuclear Magnetic Resonance Spectra of Various Polyisoprenes," Journal of the American Chemical Society, 84, 4981 (1962), and by gel permeation chromatography to measure the relative average molecular sizes in accordance with the procedure described by J. Cazes in "Gel Permeation Chromatography," Journal of Chemical Education, 43, No. 7, July 1966.

The gel permeation chromatography (GPC) of the cyclized and uncyclized cis-1,4-polyisoprenes was done in tetrahydrofuran with the Waters Associate Model 200 unit fitted with columns packed with crosslinked polystyrene gel of $10^5$, $10^4$, $7\times10^3$ and $10^2$ A. sizes. The relative average molcular sizes ($A\overline{w}$) were measured by comparing the elution time with standard narrow molecular weight polystyrenes in the range of 48,000 to 117 A., and polyethylene glycol from 780 to 50.5 A.

The infrared spectra were run on films from benzene solutions of the polymers which were dried for 5–6 hours at 65° C. under vacuum.

The high temperature NMR (i.e. nuclear magnetic resonance) spectra were run in tetrachloroethylene within one-half hour using Varian Associate Model A60. The assignments of NMR peaks are given in Table 1 below along with reported values of M. A. Golub et al., in "The Reactions of Polyisoprene with Titanium Tetrachloride," Canadian Journal of Chemistry, vol. 41, pp. 937–953 (1963); M. A. Golub et al. in Tetrahedron Letters No. 30, pp. 2137–2143 (1963); and in "Polymer Chemistry of Synthetic Elastomers Part II," J. Wiley and Sons, p. 945.

TABLE I

| Kind of proton e.g. hydrogen | Drawing legend | NMR peak positions: Room temperature (reported values) | NMR peak positions: High temperature (observed values) |
|---|---|---|---|
| (a) —CH=cyclized | 1 | 5.25 | 5.25 |
| (b) —CH= | 2 | 5.05 | 5.12 |
| (c) >C=$CH_2$ | 3 | 4.6 | 4.60 |
| (d) Unknown | | | 2.72 |
| (e) —CH—CH= | 4 | 1.95 | 2.05 |
| (f) $CH_3$—C= | 5 | 1.60 | 1.63, 1.58 |
| (g) $-CH_2-\overset{\vert}{\underset{\vert}{C}}-$ | 6 | 1.25 | 1.30 |
| (h) $CH_3-\overset{\vert}{\underset{\vert}{C}}-$ | 7 | 0.99 | 1.05, 0.92, 0.86 |

Figure 6:
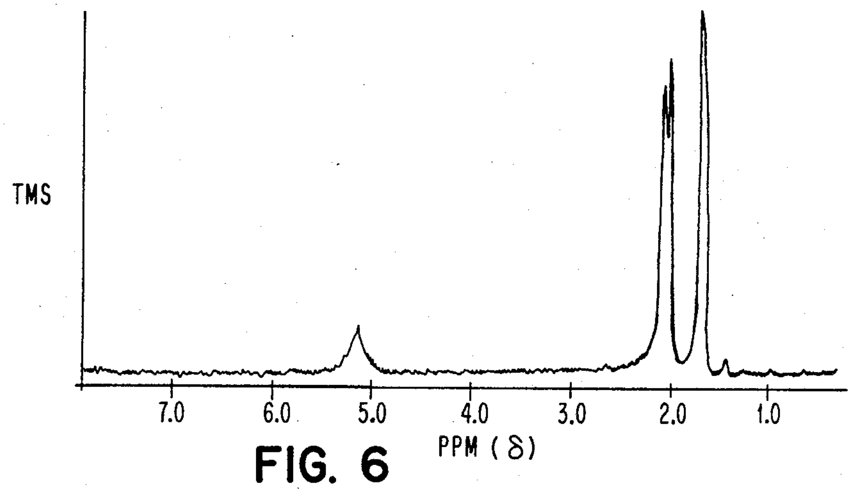
FIG. 6 shows the NMR spectrum for an uncyclized cis-1,4-polyisoprene.

As will be noted in the above table, the various proton configurations a, b, c, d, e, f, g and h are referenced to FIG. 1 by the respective numerals 1, 2, 3, 4, 5, 6 and 7. The vinyl regions were offset by 100 cycles and amplified ten fold to minimize any error in measurement of these relatively small areas. It is noted that three distinct $$CH_3-\overset{|}{\underset{|}{C}}-$$

peaks, two $CH_3$—C= peaks for the cyclized and uncyclized segments and a —CH—C= peak are readily readable and can be seen in FIGS. 2 to 5 which are NMR spectra of various cyclized polymer included in the examples below. FIG. 6 is an NMR spectra of an uncyclized cis-1,4-polyisoprene of average molecular size ($A\overline{w}$) 46,257 A. Also, an unknown peak at $\delta=2.72$ (probably —CH—C—C=) is also seen, which along with uncyclized —CH—C= and $CH_3$—C= decreased with the progress of cyclization.

Figure 7:
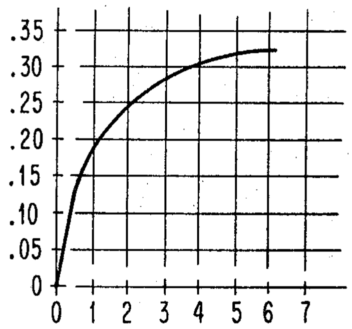
FIG. 7 is a plot of cyclicity for cyclized polyisoprene.

Since the area under the saturated methyl 7 is well resolved, the average cyclicity can be determined by calculating its ratio to the total ring protons. For mono-, bi-, tri- and tetracyclic structures, this cyclicity ratio should be 0.19, 0.25, 0.284 and 0.30 respectively, with this relationship shown in FIG. 7. The area of all the protons in the ring was calculated by measuring the area associated with the uncyclized —CH= moiety 2, ($\delta=5.12$), multiplying it by eight and deducting this value from the total area. On the basis of the average cyclicity, the areas of all the protons associated with the cyclic —CH= moiety 1 and the exocyclic C=$CH_2$ moiety 3, were calculated, and then after estimating the protons associated with the $CH_3$—C= moiety 5, by difference, the percent isoprenes going to each of these kind of structures were calculated.

Specifically, by measuring the area (B) under the straight chain external —CH= moiety 2, the percent isoprene units uncyclized (P) was calculated from the relation: $P=800\ B/e$ where $e$ is the area of the total protons. The cyclicity ratio of the $$CH_3-\overset{|}{\underset{|}{C}}-$$

moiety, 7, to the total protons in the ring can be expected to be 0.19, 0.25, 0.284 and 0.30 for the cyclicity $(n)=1$ (mono), 2 (bi), and 3 (tri), and 4 (tetracyclic) respectively. After establishing their relation, the $n$ and Q were calculated from the equations:

$$Q=3n/8(n+1)$$

and $$Q=E/e-8B$$

By measuring the area (A) belonging to the proton CH=, 1($\delta=5.25$), and the area (C) assigned C=$CH_2$, 3 (4.60) in the cyclized segments, the percent isoprenes V1 and V2, see FIG. 1, going to these structures respectively were calculated from the following equations:

$$V1=2400\ A/e(3-8Q)$$

and $$V2=1200/e\ (3-8Q)$$

The percent isoprenes V3 associated with $CH_3$—C=, 5, were estimated from the remainder of the structure using the equation:

$$V3=100-P-V1-V2$$

Various groups of polymers were prepared of varying chain lengths and cyclicity by using different reaction conditions. For synthesis 10 grams, milled or unmilled, of commercial synthetic cis-1,4-polyisoprenes (e.g. Shell 309, and 310, and Goodrich-Gulf Ameripol SN 600 having respective $A\overline{w}$'s of 57,179 A., 57,179 A., and 46,257 A.) were cyclized with p-toluene-sulfonic acid as the catalyst in refluxing xylene or toluene. The amount of p-toluene-sulfonic acid used was 7–14% based on polymer. The larger amount of catalyst, longer reaction time and higher temperature gave higher degrees of cyclization. In some cases Aerosil 200 (Eegussa Inc.) glass accelerator was used to reduce the cyclization time (and to produce highly cyclized polymers (see Ex. 6, Table II below). To some extent, gel formation occurred in all the cyclization reactions which was removed by filtration. The polymers were recovered by reprecipitation in methanol. After air-drying, they were dried overnight at 65° C., under vacuum. As noted above, the basic procedure employed was that described by J. J. Janssen in "Preparation and Use of Cyclized Rubber as a Stiffening Resin in Rubber," to which reference can be made for specific details of the synthesis.

The relative proportion of the cyclized polyisoprenes of this invention and the aryl bis-diazide sensitizers may be varied as desired or as conditions may require, but ordinarily the proportions of the sensitizer in the dried photosensitive composition will be within the range of about 1 to about 5 wt. percent of the cyclized polyisoprene with the preferred range from 2 to about 4 wt. percent.

The specific concentration of the sensitizer can generally vary over a wide range, but will ordinarily be dependent on the specific sensitizer used, on the thickness of the photosensitive layers desired or required, and on the specific application of the photoinsolubilized layer. In each individual case, the optimum concentration can be determined by techniques well known in the art.

In use, the photosensitive compositions of this invention are applied as a solution in a suitable solvent commonly employed in the art for coating polymers on suitable supports used conventionally for photoresist elements. Typical solvents include the lower alcohols such as methanol, ethanol, propanol, etc., ketones such as cyclohexanone, 2-butanone, acetone etc., dimethyl formamide, tetrahydrofuran, pyridine, benzene, toluene, xylene, methyl cellusolve acetate and mixtures thereof.

In general, any inert solvent may be employed in view of its sole function as a mere vehicle for coating the photosensitive composition on a support element, and the selection of the solvent may include those enumerated above. The solids content, e.g. of the composition, need only be sufficient to provide the desired film thickness of the composition which typically may be in the range of about 3000 A. to about 20,000 A. thickness, with solid contents of from about 7 to about 30 wt. percent in the resist solution providing such thicknesses.

Although the content of the sensitizer has been indicated to be based on the cyclized polyisoprene, it is understood that the formulation may be based on the solution itself, which in such circumstances will be in the general range of about 0.5 to about 1.5 wt. percent preferably in the range of about 0.8 to about 1.1 wt. percent.

Photoinsolubilization, (e.g. cross-linking) of the cyclized polyisoprene can be effected by simply exposing the polymer/sensitizer composition to a source of actinic radiation from any source and of any type. The light source need only furnish sufficient amount of radiation, preferably ultraviolet, to induce the desired insolubilization of the composition. Typical sources of lighting include carbon arcs, mercury vapor lamps and the like. As will be understood, the effect of the sensitizer, in the photoresist art, is not always to insolubilize the photoresist composition to all organic solvents, and in some cases, it may be necessary to choose the developing solvent with a certain degree of care, however the choice of solvents is fairly wide.

The film-forming photosensitive compositions of this invention can be coated on the support by any of the conventional methods used in the photoresist art which can include dipping, spraying, spin-coating etc. After application, the coating is driven off, as by evaporation, to leave a thin coating of the photosensitive compositions on the support, after which the coating may be exposed to suitable radiation in accordance with the conventional techniques employed in the photomechanical and photolithographic arts. Typical supports include any of the various conventional base materials to which the photosensitive compositions will adhere, such as glass, paper, resin, impregnated or reinforced paper, solid resinous sheets, metal sheets such as aluminum, zinc, magnesium, copper, etc. and the like.

After the support member has been coated with a film of the photosensitive composition and dried, it is then exposed to light (e.g. ultraviolet) in a predetermined pattern corresponding to the ultimate pattern desired. Generally such exposure is effected by means of suitable masks, negatives, stencils, templates, etc. In the event, such exposure induces photopolymerization or insolubilization of the coating in the exposed areas thereof. The exposed coating may then be developed by treating it in any suitable solvent such as listed above. Generally, because of the differential insolubility which has been induced, the solvent developer may be the same solvent in which the cyclized polyisoprene and the sensitizer were originally dissolved, e.g. prepared in, the development stage, the unexposed areas are softened and dissolved off, leaving a resist image corresponding to the exposed areas in which photoinsolubilization was induced. If desired, the coated plate may be subjected to optional heat treatments to enhance the solution of the exposed areas. For example, the exposed coating may be prebaked at low temperatures, e.g. about 80° C. to about 110° C., for a short period of time, e.g. about 10 to about 60 minutes, to increase polymerization of the coating. Also, a post-baked treatment may be employed after development to increase the strength of the resist image. For the post-bake, the film and support may be oven baked below the softening point of the support for suitable times (which illustratively may be on the order of about 130–220° C. and 120 minutes), depending on the further processing requirements for the support.

As indicated above, a specific application comprehended for the photosensitive compositions of this invention is in the fabrication of semiconductor devices. In such an application, a photosensitive composition may be coated on an oxidized surface of a semiconductor substrate followed by exposure of the coating (after drying) in a predetermined pattern, via a mask corresponding to the area of the oxide desired to be bared for further processing. The exposed coating is then developed to bare the oxide layer for further processing which, for example, may then be conventionally etched into appropriate openings for diffusion, metallization, or other operations as desired or required.

However, it is to be understood that the photosensitive compositions of this invention are also suitable for other uses. For example, they can be applied for the manufacture of printed circuits, chemical milling and in the various general fields of photomechanical and photographical reproductions, lithography and intaglio printing, such as offset printing, silk screen printing, manifold stencil sheeting coatings, lithographic plates, relief plates, gravure plates, and the like.

Four groups of polymers were prepared with varying cyclicity as follows:

(1) Average monocyclic (cyclicity 1.0–1.2)
(2) Having cyclicity of 1.2–2 with 8–16% uncyclized isoprene units.
(3) Having cyclicity of 2–2.3 with 3–6% uncyclized isoprene units.
(4) Polycyclic having a cyclicity of 6.

The 60-megacycle NMR spectra of these cyclized polymers is shown in FIGS. 2, 3, 4 and 5 in order of increasing cyclicity. The NMR data, the molecular sizes $A\bar{w}$ and polydispersity P.D. ($A\bar{n}/A\bar{n}$, i.e. weight average size/number average chain length) are summarized in Tables II, III, and IV below:

TABLE II

| | GPC wt. av. molecular size | | Cyclicity | | | Percent isoprene cyclized isomer | | | |
|---|---|---|---|---|---|---|---|---|---|
| Exhibition | A. | (P.D.) | Q [a] | $n$ | P [b] | V1 | V2 | V3 | Processing imaging |
| 1 | 17,594 | 3.2 | 0.19 | 1.0 | 21 | 41 | 6 | 32 | Does not give 10% solution, faint image. |
| 2 | 2,379 | 2.3 | 0.20 | 1.2 | 16 | 37 | 9 | 38 | Do. |
| 3 | 2,834 | 2.0 | 0.23 | 1.7 | 11 | 33 | 10 | 46 | Thin coating, good image. |
| 4 | 4,305 | 2.3 | 0.26 | 2.3 | 6 | 29 | 10 | 55 | Dissolves well, good developed image |
| 5 | 4,019 | 3.6 | 0.26 | 2.3 | 3 | 21 | 11 | 65 | Dissolves well, good developed image but poor etch, e.g. undercuts. |
| 6 | 1,733 | 4.3 | 0.32 | 6 | 4 | | | | Dissolves well but poor etch, e.g. undercuts. |

[a, b] See footnotes at end of Table IV.

TABLE III

| | GPC wt. av. molecular size | | Cyclicity | | | Percent isoprene cyclized isomer | | | |
|---|---|---|---|---|---|---|---|---|---|
| Exhibition | A. | (P.D.) | Q [a] | $n$ | P [b] | V1 | V2 | V3 | Processing imaging |
| 7 | 2,834 | 2 | 0.235 | 1.7 | 11 | 33 | 10 | 46 | 10% solution gives thin coat. |
| 8 | 4,287 | 3.7 | 0.233 | 1.7 | 9 | 35 | 10 | 46 | Good. |
| 9 | 4,993 | 2.8 | 0.222 | 1.5 | 14 | 30 | 20 | 36 | Fair developed image. |
| 10 | 6,203 | 5.8 | 0.248 | 2.0 | 16 | 38 | 15 | 31 | Poor solubility. |
| 11 | 6,666 | 3.2 | 0.253 | 2.0 | 9 | 36 | 16 | 39 | Do. |
| 12 | 15,020 | 6.1 | 0.242 | 1.9 | 14 | 36 | 14 | 36 | Very poor solubility. |
| 13 | 22,984 | 3.8 | 0.235 | 1.7 | 13 | 43 | 10 | 34 | Extremely poor solubility. |

[a,b] See footnotes at end of Table IV.

TABLE IV

| | GPC wt. av. molecular size | | Cyclicity | | | Percent isoprene cyclized isomer | | | |
|---|---|---|---|---|---|---|---|---|---|
| Exhibition | A. | (P.D.) | Q [a] | $n$ | P [b] | V1 | V2 | V3 | Processing imaging |
| 14 | 4,019 | 3.6 | 0.26 | 2.3 | 3 | 21 | 11 | 65 | Dissolves well, good developed image, poor etch resistance. |
| 15 | 4,305 | 2.3 | 0.26 | 2.3 | 6 | 29 | 10 | 55 | Do. |
| 16 | 6,113 | 5.5 | 0.257 | 2.2 | 6 | 22 | 18 | 54 | Do. |
| 17 | 8,762 | 3.3 | 0.25 | 2.0 | 6 | 23 | 17 | 54 | Poor solubility. |

[a] Q = Ratio $\frac{CH_3—\overset{|}{\underset{|}{C}}—}{\text{Total ring H}}$

[b] Calculated percent isoprene, uncyclized (—CH=, 2 in FIG. 1).

The monocyclic polymers (Table II, Ex. 1 and 2), in general have a higher percent of uncyclized isoprenes. Their NMR's (e.g. Ex. 1 in FIG. 2) show a large split $CH_3$—C=/peak ($\delta$=1.58, 1.63) indicating that a fair amount of this group is in the uncyclized, as well as in the cyclized, portions of the polymer. Table II also shows that, as we go from a cyclicity of 1 to the structure of higher cyclicity (e.g. 2.3), the percent of uncyclized units and the amount of —CH=, 1, moiety decreases, whereas the $CH_3$—C=, 5, moiety increases. By comparison of the NMR spectra of monocyclic polymer (FIG. 2), a polymer of 1.5 cyclicity having 14% uncyclized units (FIG. 3B), bicyclic polymer having 3% uncyclized units (FIG. 4) and polycyclic (FIG. 5) with each other, it will be observed that with the increase in cyclicity, the $$CH_3—\overset{|}{\underset{|}{C}}=,\ 7$$

moiety peaks ($\delta$=1) peaks increase.

Figure 8:
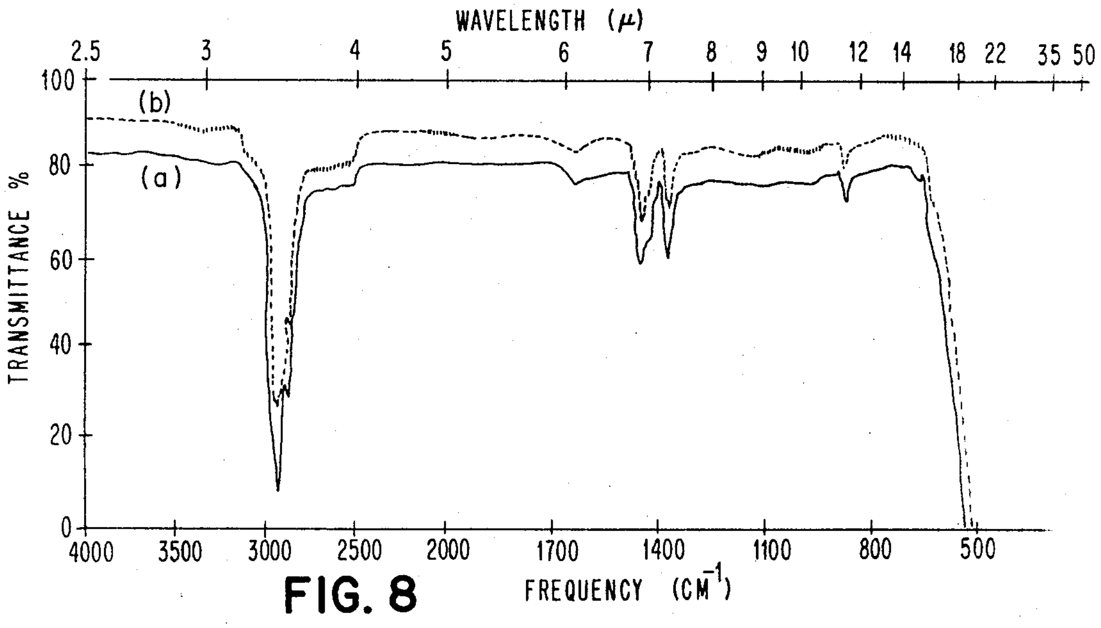
FIG. 8 shows IR spectra for two cyclized polyisoprene polymers.

The polymers having a cyclicity of 1.5 to 2 with 9–16% uncyclized units, ranging in their molecular sizes from 2834 to 22,984 A. are listed in Table III. The NMR spectra of Examples 8 and 9 are shown in FIGS. 3A and 3B respectively. As can be seen, the structures —CH=, 1, and $CH_3$—C=, 5, in the cyclic segments are preferred equally well in this cyclicity range. The IR spectra of the Examples 8 and 9 polymers showing a large >C=$CH_2$, 3, wag at 11.25 microns are shown in FIGS. 8A and 8B respectively.

Figures 2, 3, 4, 5:
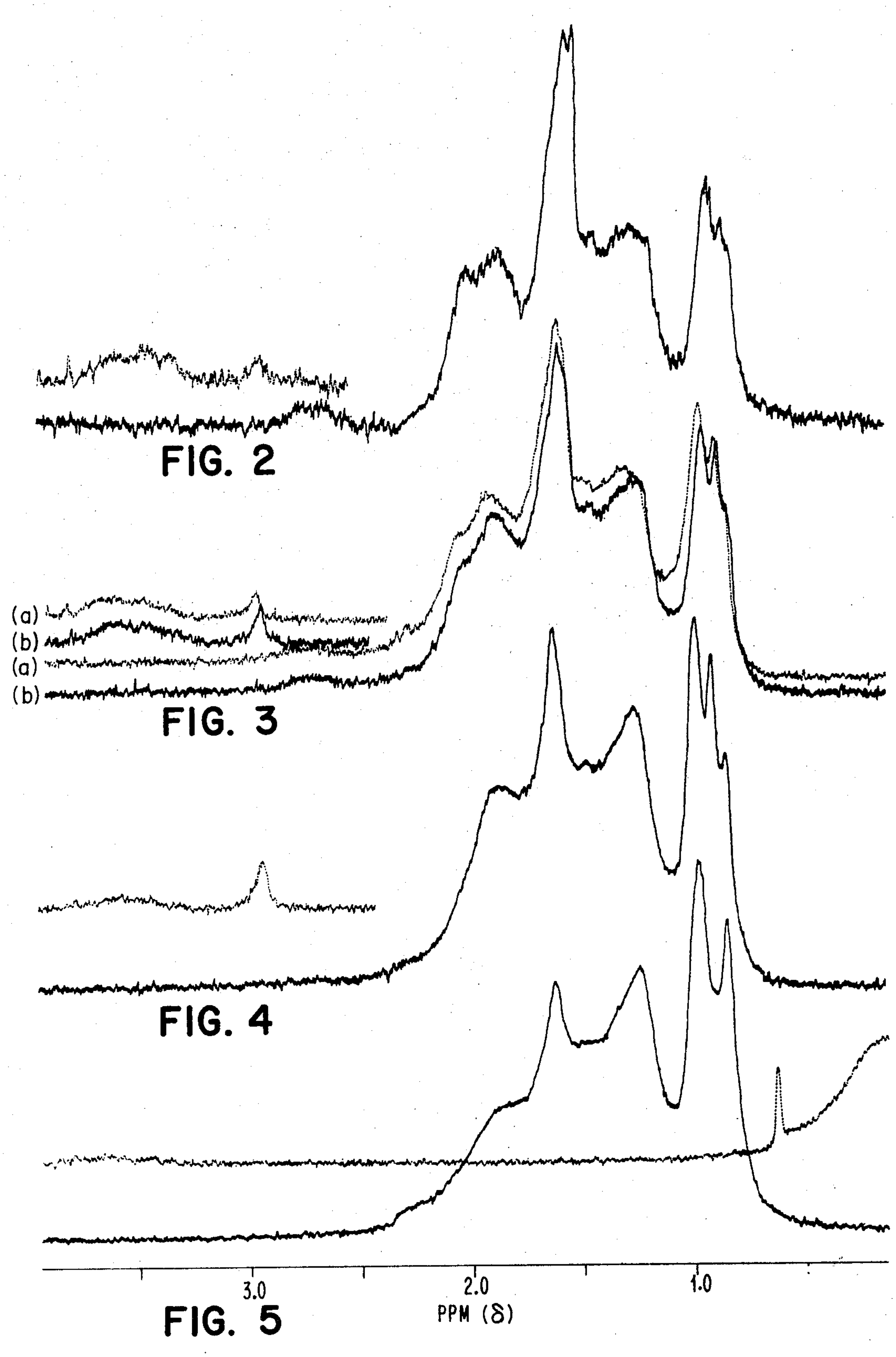
FIGS. 2 to 5 show the NMR spectra for cyclized polyisoprene of various degrees of cyclicity.

Polymers varying in cyclicity between 2 to 2.3 having 3 to 6% uncyclized units, and varying in molecular sizes between 4019 and 8762 A. are given in Table IV. The NMR spectrum of Example 14 is shown in FIG. 4. These polymers differ from the class given in Table III in that they have less —CH=, 1, moieties (e.g. 54–65%) in the cyclic segments of the polymers.

The NMR spectrum of a polycyclic polymer (e.g. Example 6, Table II) which was obtained upon refluxing the uncyclized polyisoprene with the catalyst and accelerator for 24 hours is shown in FIG. 5. In this case the >C=$CH_2$ (e.g. 3, FIG. 1) protons and 11.25 microns wag in the IR has almost disappeared. The large $$CH_3—\overset{|}{\underset{|}{C}}—,\ 7$$

($\delta$=1) peaks gave a ratio of the saturated methyls to total ring protons to be 0.324 indicating that it is at least tetracyclic.

Evaluation of the polymers for photoresist applications was made by coating solutions thereof on silicon wafers having 6000 A. thick $SiO_2$ using conventional spinning methods. The coated wafers were prebaked at 105° C. for 30 minutes, and then exposed by contact printing using a high pressure 200 watt U.V. lamp. The images were developed for three minutes in Eastman Kodak KOR developer. The exposed wafers were post-baked at 180° C. prior to etching for six minutes in $NH_4F$—buffered HF (e.g. 8:1) in accordance with common practice in the semiconductor industry. In general, the formulation of the resist solution used was a 9 wt. percent solution of the polymers in xylene (unless otherwise mentioned). To the resist solution 3 wt. percent (based on the polymer) of 2,6-bis ($\Delta$4′-azidobenxylidene)-4-methyl cyclohexanone photoinitiator. The ability of these resist solutions to resolve 1.5 microns developed lines is illustrated in FIGS. 9 to 14 shown at 750× magnification with appropriate analysis and observations set out below.

MONOCYCLIC POLYMERS (TABLE II, EXAMPLES 1 AND 2)

Figure 9:
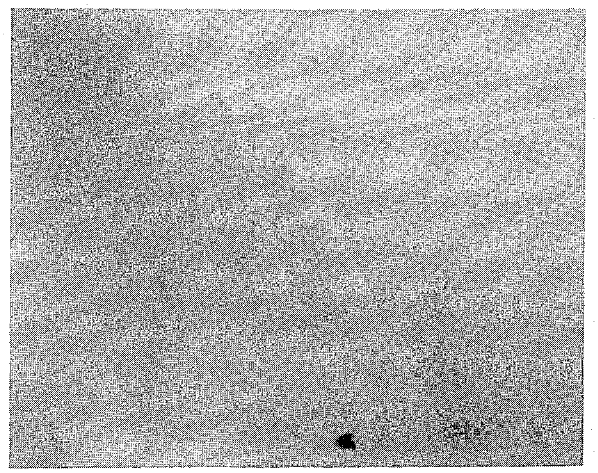
FIGS. 9 to 14 show developed photoresist images at 750× magnification.

Neither of the two polymers could be obtained as a 9% solution. Even a 5% solution of the polymer having a 17,594 A. chain length was too viscous and had filtration problems. The developed images were shallow, as can be seen in FIG. 9. The polymer which was in direct contact with the wafer could not be completely dissolved by the developer after prebaking. The buffered HF etchant did not attack the polymer or its images.

POLYMERS HAVING CYCLICITY OF 1.5–2, WITH 9–16% UNCYCLIZED ISOPRENE UNITS (TABLE III)

Figure 10:
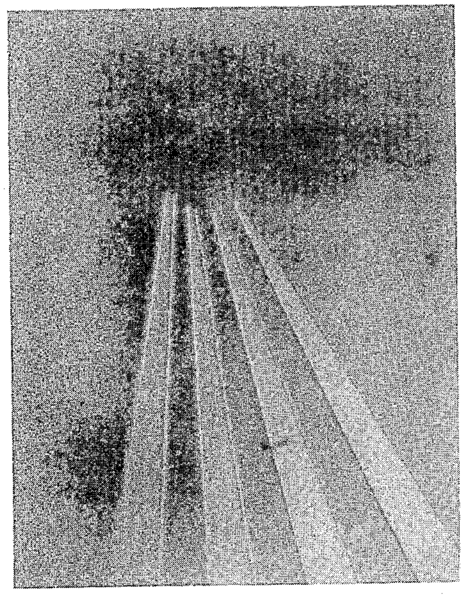
Figure 11:
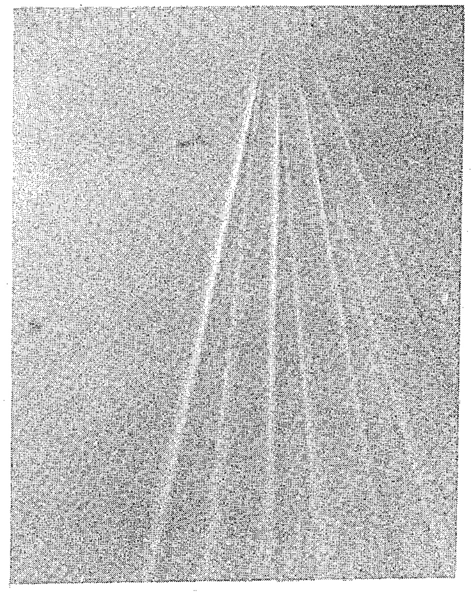

The polymers of Examples 7, 8, and 9 (chain lengths of 2,834–4, 993 A.) dissolved well and gave good developed images. FIGS. 10 and 11 show developed lines from the Example 8 and 9 polymers respectively, where the deep areas under the fan in FIG. 10 show $SiO_2$ against a photoresist background, whereas in FIG. 11 the dark areas represent insolubilized photoresist. The polymers having 9% uncyclized isoprene units gave sharper images than the one having 14%. The polymers having chain lengths of above 6000 A. ($A\overline{w}$) showed increasingly poor solubility and gave shallow images which also stripped off.

POLYMERS HAVING CYCLICITY OF 2–2.3 WITH 3–6% UNCYCLIZED ISOPRENE UNITS (TABLE IV)

Figure 12:
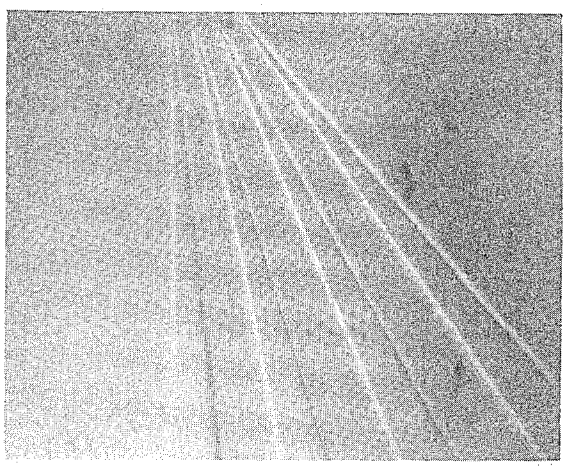
Figure 13:
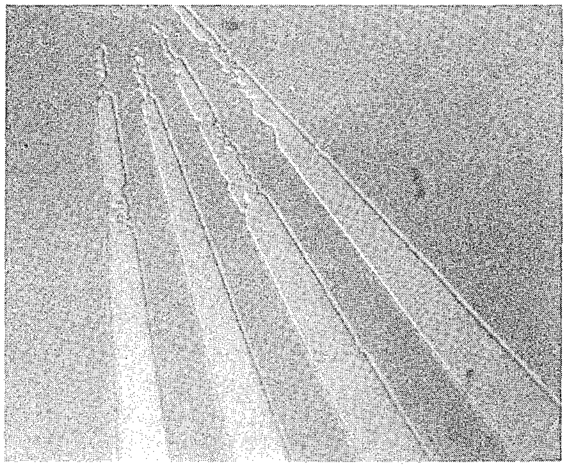

Polymers having chain lengths of 4,019–6,113 A. dissolved well and produced good developed images as examplified in FIG. 12. The deep areas represent the insolubilized photoresist against a $SiO_2$ background. The polymer of 8,762 A. chain length showed poor solubility and developing properties. All of the polymers indicated poor etch resistance toward buffered HF etchant as can be seen in FIG. 13.

POLYCYCLIC (TABLE II, EXAMPLE 6)

Figure 14:
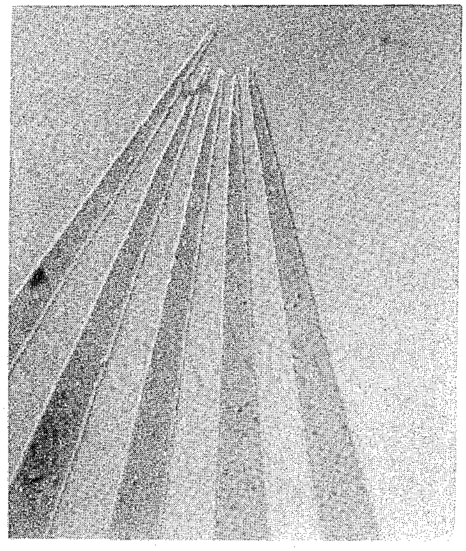

A 15% solution of this polymer was prepared, with behavior similar to the immediately preceding group. This polymer was prepared using Aerosil 200 accelerator, which could not be removed completely, as can be seen in FIG. 14, where the dark area are $SiO_2$ with poor edges against silicon in the background.

The foregoing show that cyclized polyisoprenes having a cyclicity, *n*, of 1.3 to 2 with 6 to 14% uncyclized units and chain lengths from 3000 to 6000 A. ($A\overline{w}$) provide the necessary resolution, adhesion, solubility, developing properties and etch resistances required in photoresist the further ultraminiturization of semiconductor devices.

What is claimed is:

1. A film-forming light-sensitive photoresist coating composition comprising:

an aryl bis-diazide sensitizer and a cyclized cis-1, 4-polyisoprene polymer having (a) a cyclicity of about 1.4 to about 1.8

(b) from about 9% to about 14% uncyclized isoprene units, and (c) a weight average molecular size of from about 4000 A. to about 5000 A.

2. The composition of claim 1 wherein said sensitizer comprises from about 1 to about 5 wt. percent based on said polymer.

3. The composition of claim 1 wherein said sensitizer comprises: 2,6-bis (4′-azidobenzylidene)-4-methyl cyclohexanone.

4. The composition of claim 3 wherein said sensitizer comprises from about 1 to about 5 wt. percent based on said polymer.

5. A light-sensitive element comprising a support and a coating thereon of a composition comprising an aryl bis-diazide sensitizer and a cyclized cis-1,4-polyisoprene polymer having (a) a cyclicity of about 1.4 to about 1.8, (b) from about 9% to about 14% uncyclized isoprene units, and (c) a weight average molecular size of from about 4000 A. to about 5000 A.

6. The element of claim 5 wherein said sensitizer comprises from about 1 to about 5 wt. percent based on said polymer.

7. The element of claim 5 wherein said sensitizer comprises 2,6-bis (4′-azidobenzylidene)-4-methyl cyclohexanone.

8. The element of claim 7 wherein said sensitizer comprises from about 1 to about 5 wt. percent based on said polymer.

References Cited

UNITED STATES PATENTS 3,591,378 7/1971 Altman ............ 96—91 N
2,940,853 6/1960 Sagura et al. .......... 96—75
2,852,379 9/1958 Hepher et al. ........ 96—91 N

OTHER REFERENCES

Levine et al., Kodak Photoresist Seminar Proceedings, 1968 edition, vol. 1, pp. 16, 17.

NORMAN G. TORCHIN, Primary Examiner

J. WINKELMAN, Assistant Examiner

U.S. Cl. X.R.

96—91 N